US006387784B1

(12) United States Patent
Chong et al.

(10) Patent No.: US 6,387,784 B1
(45) Date of Patent: May 14, 2002

(54) METHOD TO REDUCE POLYSILICON DEPLETION IN MOS TRANSISTORS

(75) Inventors: Yung Fu Chong; Randall Cher Liang Cha, both of Singapore (SG); Lap Chan, San Francisco, CA (US); Kin Leong Pey, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/810,121

(22) Filed: Mar. 19, 2001

(51) Int. Cl.[7] .......................................... H01L 21/4763
(52) U.S. Cl. ........................................ 438/585; 438/593
(58) Field of Search ................................. 438/585–597

(56) References Cited

U.S. PATENT DOCUMENTS

| | | | |
|---|---|---|---|
| 4,555,842 A | 12/1985 | Levinstein et al. | 29/571 |
| 4,619,034 A | 10/1986 | Janning | 29/571 |
| 5,879,975 A | * 3/1999 | Karlsson et al. | 438/162 |
| 5,908,307 A | 6/1999 | Talwar et al. | 438/199 |
| 5,966,605 A | * 10/1999 | Ishida | 438/299 |
| 6,001,714 A | 12/1999 | Nakajima et al. | 438/525 |
| 6,069,061 A | * 5/2000 | Lin et al. | 438/517 |
| 6,090,651 A | 7/2000 | Puchner et al. | 438/199 |
| 6,159,810 A | * 12/2000 | Yang | 438/301 |
| 6,297,115 B1 | * 10/2001 | Yu | 438/305 |
| 6,297,135 B1 | * 10/2001 | Talwar et al. | 438/592 |

* cited by examiner

Primary Examiner—Richard Booth
(74) Attorney, Agent, or Firm—George O. Saile; Rosemary L. S. Pike; Sergin Oktay

(57) ABSTRACT

A method is provided to reduce poly depletion in MOS transistors. Conventionally, after a polysilicon electrode has been doped, an anneal step is usually performed to activate the dopants. However, the anneal step may be insufficient to drive the implanted impurities down the entire depth of the polysilicon electrode. Consequently, a portion of the polysilicon gate nearest to the gate oxide will be depleted of dopants. This poly depletion will have a detrimental effect on the control of the threshold voltage, and hence on the performance of the device. It is disclosed in the present invention a method of forming polysilicon gates where dopant depletion at the interface near the gate oxide layer is alleviated substantially by using laser annealing; however, by first pre-amorphizing the polycrystalline silicon prior to ion (implantation to a desired depth such that during laser annealing the dopants will diffuse uniformly to a melt depth. In this manner, poly depletion effect is greatly reduced and hence performance of the device improved. The disclosed method is applicable to both $n^+$ doped polysilicon gates (NMOS) and $p^+$ doped polysilicon gates (PMOS).

25 Claims, 3 Drawing Sheets

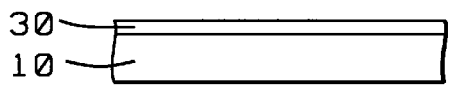
*FIG. 1a –
Prior Art*
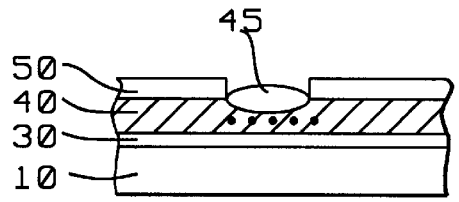
*FIG. 1d –
Prior Art*
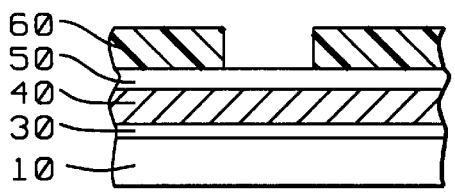
*FIG. 1b –
Prior Art*
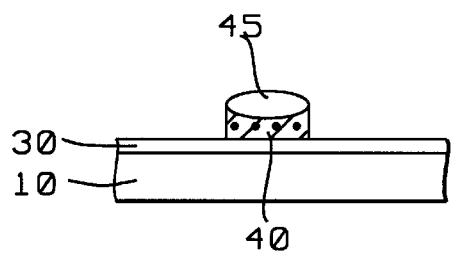
*FIG. 1e –
Prior Art*
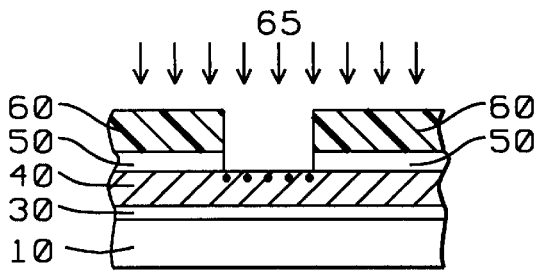
*FIG. 1c –
Prior Art*
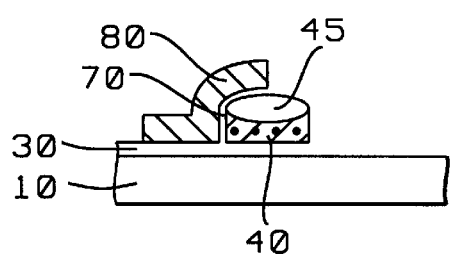
*FIG. 1f –
Prior Art*

METHOD TO REDUCE POLYSILICON DEPLETION IN MOS TRANSISTORS

BACKGROUND OF THE INVENTION (1) Field of the Invention

The present invention relates to semiconductor devices in general, and in particular, to a method of reducing polysilicon depletion in MOS transistors.

(2) Description of the Related Art

One of the detrimental effects of the present drive to obtain ever smaller geometries in semiconductor devices is the degradation of the conductivity of polysilicon gate electrodes which are important in determining the performance of such devices. This is because, as the width of the gate electrode is reduced or shrunk, the conductivity of the gate electrode also tends to be reduced, which in turn, tends to reduce the efficiency of the gate electrode by way of impacting the speed and other aspects of the device. In addition, the reduction in the amount of dopant activated in a low thermal budget process tends to cause carrier depletion at the interface between the gate electrode and the gate dielectric. This situation additionally effects the ability of the device to perform. It is disclosed later in the embodiments of the present invention a method of reducing dopant depletion in polysilicon gates in order to regain the performance as it would be present in the larger and unshrunk devices. It will be apparent then to those skilled in the art that the fact that the later disclosed method is applicable to both complementary MOS (CMOS) logic devices as well as the memory devices makes the method that more advantageous to the art of making semiconductor devices in general.

A conventional method of forming gate electrodes in a metal-oxide semiconductor (MOS) memory device is shown in FIGS. 1a–1f. However, it will be understood by the skilled that conventional CMOS methods may have just as well been cited here for purposes of illustrating the forming of gate electrodes. Thus, in FIG. 1a, layer of gate oxide (30) is thermally grown over substrate (10) using conventional methods. Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The polysilicon layer is then doped through ion implantation (65), followed by a conventional anneal step (not shown) to activate the dopants. Normally, the anneal step is insufficient to drive the implanted impurities down the entire depth of polysilicon layer (40). This is called the "poly depletion effect" which results in poor control of the threshold voltage, and for which a remedy is disclosed later in the embodiments of the present invention. Subsequently, photoresist layer (60), which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are covered by the polyoxide (FIG. 1e). The control gate is formed by depositing second polysilicon layer (80) over intergate layer (70), also known as interpoly, which separates the two polysilicon layers, namely, the floating polygate and the control polygate.

As integrated circuit geometries shrink, the relationships between the individual elements of the circuits also lend to change. Thus, the gate electrodes of a device such as shown in FIG. 1f are preferably spaced at reduced distances one from the other, in support of the overall reduced device geometry. However, the reduced distances between adjacent polysilicon gates tends to make them more difficult to fabricate. One reason for this is that one gate electrode over a complementary device may be oppositely doped in relation to another gate electrode over an adjoining complementary device. Before patterning the gate electrode layer, the reduced distance between the oppositely doped regions of the gate electrode layer tends to allow the dopans to diffuse into the adjoining regions. This tends to reduce or even destroy the intended effect of the dopants in the gate electrode regions, resulting in a degradation of the integrated circuit.

In related art, Puchner, et al., of U.S. Pat. No. 6,090,651 address the problems cited above, and disclose a method of forming depletion free polysilicon electrodes by first forming a supersaturated layer on a semiconductor CMOS device, where an initial phase layer is deposited on the semiconductor device. The initial phase layer has a solid phase dopant saturation level and a liquid phase dopant saturation level, where the liquid phase dopant saturation level is greater than the solid phase dopant saturation level. A concentration of a dopant is impregnated within the initial phase layers, where the concentration of the dopant is greater than the solid phase dopant saturation level and no more than about the liquid phase dopant saturation level. The initial phase layer is annealed, without appreciably heating the semiconductor device, using an amount of energy that is high enough to liquefy the initial phase layer over a melt duration. This dissolves the dopant in the liquefied initial phase layer. The amount of energy is low enough to not appreciably gasify or ablate the initial phase layer. The liquefied initial phase layer is cooled to freeze the dissolved dopant in a supersaturated, electrically activated concentration, thereby forming the supersaturated layer. An initial phase layer of either polysilicon or amorphous silicon may then be deposited over the CMOS device. After laser annealing, the initial phase layer is transformed into a doped polysilicon gate electrode that can be patterned and further processed.

Nakajima, et al., in U.S. Pat. No. 6,001,714 disclose a different method of manufacturing a polysilicon thin film transistor (TFT). With this method, a dopant is implanted into a polysilicon thin film formed on an substrate with a gate having a tapered edge which is used as a mask to form a source and a drain. An energy beam then slantingly irradiates from the side of the edge of the gate to the surface of the substrate. Thus, the source and drain are activated and, at the same time, the energy beam exposes the polysilicon thin film below the edge of the gate to activate the channel region implanted the dopant.

Still another method is disclosed by Talwar, et al., in U.S. Pat. No. 5,908,307 for fabricating field effect transistors (FET) with reduced dimensions. Here, a given surface layer of crystalline silicon is first amorphized to a given depth. Thereafter a given amount of doping material is deposited as a film on the surface of the given amorphized surface layer of the silicon. Then, a portion of the given amorphized surface layer of the silicon is temporarily heated for a certain time to a temperature which is sufficient to melt amorphized silicon but is insufficient to melt crystalline silicon (since the melting temperature of amorphized silicon is substantially below that of crystalline silicon). After a predetermined heating time, the melted silicon of the heated portion is permitted to cool, thereby effecting a recrystallization of the silicon of this portion of the given surface layer. The layer is then patterned and further processed.

Janning of U.S. Pat. No. 4,619,034 discloses a nonvolatile memory device which utilizes a laser beam recrystallized silicon layer having source-channel-drain regions. The method comprises forming a conductive polysilicon gate on a substrate followed by a memory nitride layer deposition thereon. A thick oxide layer is formed over the nitride followed by removal of the thick oxide corresponding to a central portion of the gate thereby exposing the nitride there beneath. The exposed nitride surface is thermally converted into a thin, stoichiometric memory $SiO_2$. According to Janing, doped polysilicon layer is then formed on the structure and thereafter converted to recrystallized silicon by subjecting it to laser radiation. The recrystallized silicon is patterned into the device active area and a source and drain in alignment with the underlying gate are implanted therein.

Levinstein, et al., on the other hand, show, in U.S. Pat. No. 4,555,842, a method directed to the fabrication of a VLSI CMOS device of the type that comprises complementary-threshold-voltage NMOS and PMOS transistors which include silicide-on-doped polysilicon gates. The method comprises forming a polysilicon layer on a substrate, selectively introducing dopants into specified regions of the layer, forming a cap layer on the doped polysilicon layer, and heating the device with the cap layer in place to lock dopants in lattice sites in the specified regions of the polysilicon layer.

The present invention discloses a different method of forming polysilicon gates, or electrodes, where dopant depletion at the interface near the gate dielectric layer is alleviated substantially by using laser annealing; however, by first pre-amorphizing the polycrystalline silicon prior to ion implantation to a desired depth such that during laser annealing the dopants will diffuse uniformly to the melt depth. In this manner, poly depletion effect is greatly reduced and hence performance of the device improved. The disclosed method is applicable to both $n^+$ doped polysilicon gates (NMOS) and $p^+$ doped polysilicon gates (PMOS), as well as to the floating gate and control gates of memory devices.

SUMMARY OF THE INVENTION

It is therefore an object of the present invention to provide method of forming a polysilicon electrode with reduced dopant depletion effect.

It is another object of this invention to provide a method of utilizing laser annealing to reduce poly depletion in MOS transistors.

It is yet another object of the present invention to provide a method of utilizing laser annealing to reduce poly depletion in both the floating and control gates of memory devices.

It is still another object of this invention to provide a method of pre-amorphizing a polycrystalline layer prior to ion implantation to a desired depth such that during laser annealing, these dopants will diffuse uniformly to a desired melt depth.

It is an overall object of the present invention to provide a method of forming poly electrodes in transistors and memory devices where the desired threshold voltage is obtained and the effects of deep submicron shrinkage is mitigated in favor of regained dopant depth through a judicious laser annealing subsequent to ion implantation of the electrodes.

These objects are accomplished by providing a substrate; forming a pad oxide layer over said substrate; forming a nitride layer over said pad oxide layer; patterning said nitride layer to form a trench over said pad oxide layer; removing said pad oxide layer and exposing said substrate at the bottom of said trench; optionally forming and removing a sacrificial layer; forming a gate oxide layer over said substrate at the bottom of said trench; forming a polysilicon layer over said substrate, including within said trench; performing chemical mechanical polishing (CMP) to remove excess polysilicon over said trench; etching said polysilicon layer in said trench to a desired thickness; in-situ amorphizing upper portion of said polysilicon layer by implanting ions into said polysilicon layer to form an amorphous (α-Si) layer over said polysilicon layer; doping said polysilicon layer by implanting ions; performing laser irradiation of selected wavelength and fluence to melt and regrow said α-Si layer while at the same time driving said ions deeply into said polysilicon electrode reaching but adjacent said underlying oxide layer; and continuing the completion of said MOS transistor by depositing another material (e.g., metal) into the trench, followed by CMP, for making contact.

DESCRIPTION OF THE DRAWINGS

FIGS. 1a–1f are cross-sectional views of a portion of a semiconductor substrate showing the steps of forming gate electrodes for a conventional flash memory cell.

DESCRIPTION OF THE PREFERRED EMBODIMENTS

Figure 2A:
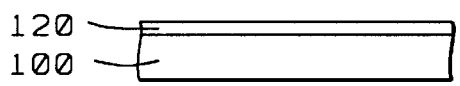
FIG. 2a is a cross-sectional view of a portion of a semiconductor substrate showing the forming of a layer of pad oxide over the substrate, according to this invention.

The present invention discloses a method of forming polysilicon gates, or electrodes, where dopant depletion at the interface near the gate dielectric layer is alleviated by subjecting the dopants to higher temperatures of 1200–1400° C. through laser annealing than is possible through conventional techniques of using rapid temperature annealing (RTA) (e.g., about 1,100° C.), or furnace annealing (800–900° C.). At higher temperatures, more dopants get activated, and accordingly, the more conductive the gate gets to be. However, silicon substrate is first pre-amorphized prior to ion implantation to a desired depth such that during laser annealing the dopants diffuse uniformly to the melt depth. In this manner, poly depletion effect is greatly reduced and hence performance of the device improved. The disclosed method is applicable to both n+ doped polysilicon gates (NMOS) and p+ doped polysilicon gates (PMOS), as well as to the floating gate and control gates of memory devices.

More specifically, referring now to the drawings, in particular to FIGS. 2a–2i, there are shown steps of forming a polysilicon electrode without the poly depletion that is normally found in conventional methods of forming MOS and memory devices. This is accomplished by first depositing a polysilicon layer, and then amorphizing the layer using ion implantation, followed by the implantation of dopant ions. It will be apparent to those skilled in the art that the amorphous/damaged layer so formed will exhibit lower melting point than polycrystalline silicon. Upon utilizing the main feature of the present invention, namely, laser annealing, the amorphous/damaged layer melts and the dopant diffusion is limited by the previously defined depth of amorphization. This step increases the process margin because it decreases the threshold laser fluence needed to melt the polysilicon gate layer. In this manner, the gate dielectric layer and the elements surrounding the gate will not be heated substantially, while at the same time driving the dopants to a depth, which at least equals the length of the gate, thus providing the desired performance for the device.

Specifically, FIG. 2a shows a partial cross section of a semiconductor substrate, preferably silicon. A pad dielectric layer, (120), is formed over substrate (100). Pad dielectric (120) can be formed by thermal oxidation process at a temperature between about 700° C. to 1000° C. Alternatively, the pad oxide can be formed by an atmospheric or low pressure chemical vapor deposition (LPCVD) process as is well known. Pad oxide layer (120) has a thickness between about 100 to 600 angstroms (Å).

Figure 2D:
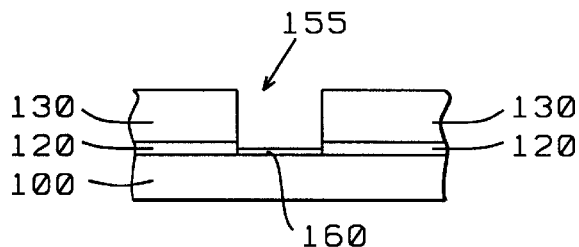
FIG. 2d is a cross-sectional view of a portion of the substrate showing the forming of gate dielectric in the trench of FIG. 2c, according to the present invention.
Figure 2B:
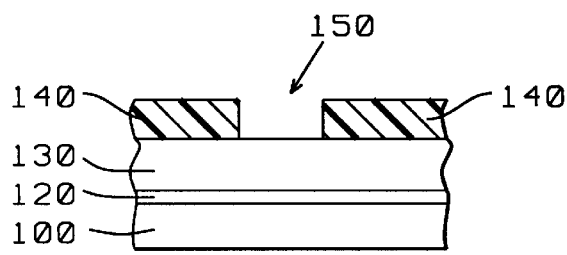
FIG. 2b is a cross-sectional view of a portion of the substrate of FIG. 2a showing the forming of a nitride layer followed by the forming of a photoresist mask, according to the present invention.

Next, nitride layer (130) is formed over layer (120), as shown in FIG. 2b. Preferably, the nitride layer is chemical vapor deposited (CVD) by reacting $SiH_4$ with $N_2O$ and $NH_3$ at a temperature between about 300 to 900° C. The preferred thickness of layer (130) is between about 1000 to 3000 Å.

Figure 2E:
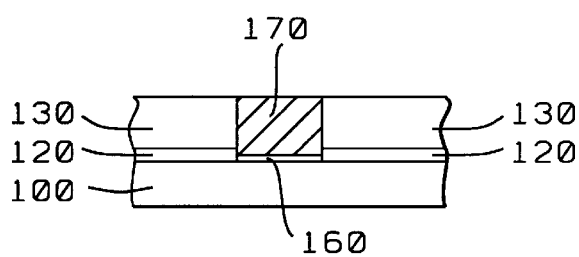
FIG. 2e is a cross-sectional view of a portion of the substrate showing the forming of a polysilicon electrode in the trench of FIG. 2c, according to the present invention.
Figure 2C:
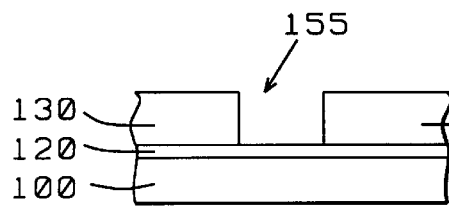
FIG. 2c is a cross-sectional view of a portion of a substrate showing the forming of a trench in the nitride layer of FIG. 2b, according to the present invention.

At the next step, using conventional techniques, photoresist layer (140) is formed over the nitride layer to form a photoresist mask having pattern (150) corresponding to the area where gate electrode is to be defined as shown in FIG. 2b. Pattern (150) is then etched into nitride layer (130) forming a trench, (155), as shown in FIG. 2c. The etching is accomplished using a recipe comprising gases Ar, $CHF_3$, $C_4F_8$. Pad oxide layer now exposed at the bottom of the trench is also removed. This is accomplished with a recipe comprising $NH_4$, HF wet chemistry, or $CHF_3$, $CF_1$ dry chemistry. Then, photoresist layer (140) is removed using oxygen plasma ash, preferably.

Optionally at the next step, a sacrificial oxide is formed and removed, using conventional methods, so as to remove any damaged surface material on the underlying substrate. Following the optional step, gate oxide layer (160) is grown in trench (155) as shown in FIG. 2d to a thickness between about 10 to 150 Å, and at a temperature between about 900 to 1200° C. Alternatively, a gate dielectric material with a high value of dielectric constant can be deposited via chemical vapor deposition (CVD). Subsequently, polysilicon is formed over the substrate, thus filling trench (155), through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 400 to 700° C. The preferred thickness is between about 1100 to 5000 Å. Any excess polysilicon over the substrate is removed by using chemical mechanical polishing (CMP), thus leaving layer (170) planarized in the trench with respect to the surface of substrate (100), as shown in FIG. 2e. Selective and controlled etching of polysilicon layer (170) to a desired thickness is then performed to form layer (175), FIG. 2f.

The next critical step of amorphizing the polysilicon just formed is dictated by a main feature of the present invention, namely, laser annealing of the polysilicon layer which is to serve as an electrode. The thickness of the polysilicon layer to be amorphized must be such that a relatively low laser fluence is required to melt a relatively "thin" (preferably, between about 100 to 1500 Å) upper amorphous layer, and not the lower unmolten polysilicon layer, and yet as close to the underlying gate oxide layer as possible. Thus, the energy of the ion implantation for amorphization of the polysilicon layer is chosen depending upon the depth of the amorphization and how close the amorphous layer would be formed to the gate/gate dielectric interface. In general, it is desirable to have the amorphous layer as close to the gate dielectric layer as possible to prevent any carrier depletion in the gate electrode. However, it will be noted that the range of the ions should not be greater than the thickness of the polysilicon layer, for otherwise, the ions would penetrate into the gate dielectric layer and would degrade the quality of the gate dielectric.

Figure 2F:
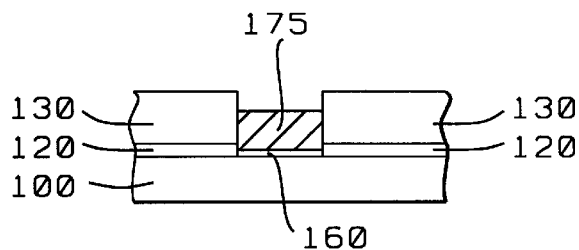
FIG. 2f is a cross-sectional view of a portion of the substrate showing the selective etching of the polysilicon in the trench of FIG. 2e, according to the present invention.
Figure 2G:
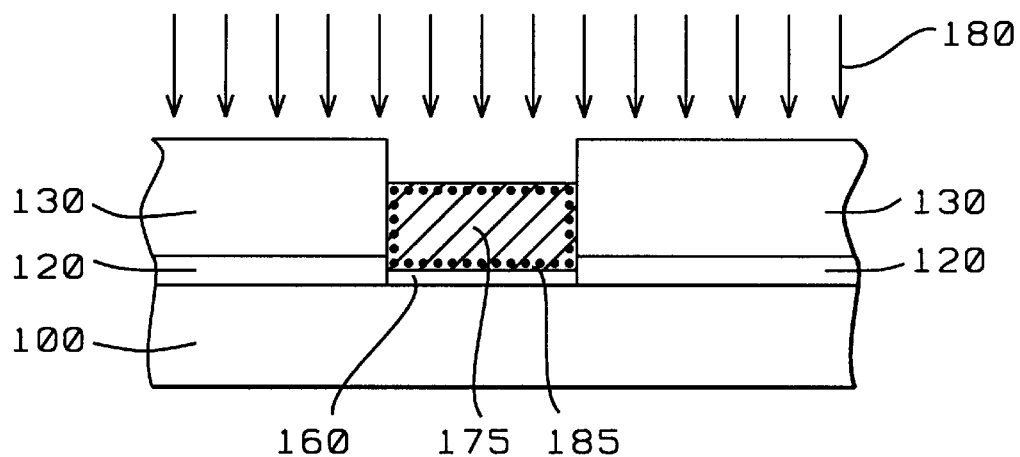
FIG. 2g is a cross-sectional view of a portion of the substrate showing the ion implantation of the polysilicon electrode of FIG. 2f for the amorphization of an upper layer of the polysilicon, according to the present invention.

Thus, it is preferred that the thickness of the polysilicon layer, layer (175) in FIG. 2f, is between about 500 to 2000 Å, which is obtained by selectively etching it with a recipe comprising said etching said polysilicon layer is accomplished with a recipe comprising $Cl_2$, $HeO_2$, HBr, He. And the ions selected to amorphize an upper portion of layer (175) is dependent upon the dopant impurity that will be used to dope the polysilicon layer at the next step. For a PMOS device, the ions can be either silicon, $Si^+$, or germanium, $Ge^+$, at a dosage level between about $1\times10^4$ to $1\times10^{16}$ atoms/cm$^2$ and energy between about 50 to 200 KeV. On the other hand, for an NMOS device, the dopant will be arsenic, $As^+$, and hence this step will not be necessary as the dopant will be self-amorphizing. Ion implantation at this pre-amorphizing step is depicted in FIG. 2g.

Figure 2H:
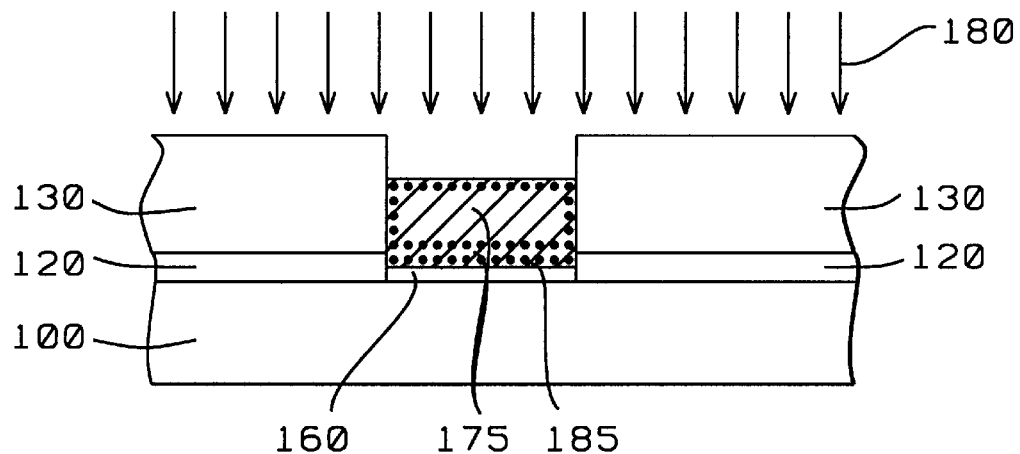
FIG. 2h is a cross-sectional view of a portion of the substrate showing the doping of the polysilicon electrode of FIG. 2g, according to the present invention.

The dopant implantation ions shown in FIG. 2h can be $B^+$, $BF_2$, $As^+$ or $p^+$, at a dosage level between about $5\times20^4$ to $1\times10^{16}$ atoms/cm$^2$ and energy between about 0.5 to 50 KeV. The amorphous/damaged layer so formed exhibits lower melting point than polycrystalline silicon. Upon laser annealing at the next step, the amorphous/damaged layer melts and dopant diffusion is limited by the previously defined depth of amorphization. This step increases the process margin because it decreases the threshold laser fluence needed to melt the polysilicon gate layer. In this manner, the gate dielectric layer and the elements surrounding the gate will not be heated substantially.

Just as the energy of ion implantation for amorphization is chosen depending upon the desired depth of amorphization and how close the amorphous layer should be to the gate/gate dielectric interface, so is the selection of laser fluence chosen just sufficient so as to melt only the amorphous/damaged polysilicon layer without melting the underlying polycrystalline silicon. In the event that the amorphous layer is so close to the gate/gate dielectric interface so that the whole polysilicon layer melts, the laser fluence also should not cause substantial heating in the gate dielectric layer and the elements surrounding the gate. In this case, amorphous silicon will be obtained on cooling of the melt instead of the polycrystalline silicon.

Figure 2I:
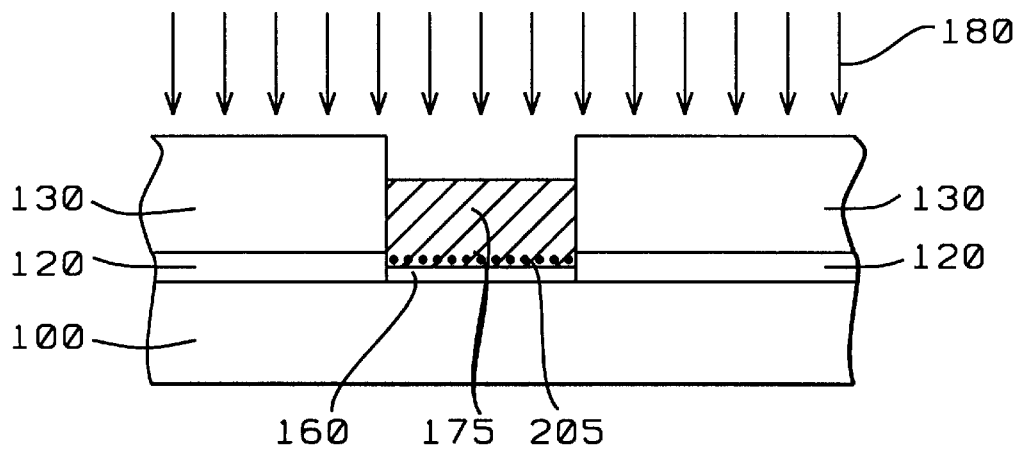
FIG. 2i is a cross-sectional view of a portion of the substrate showing the laser annealing of the polysilicon electrode of the present invention.

Thus, the preferred wavelength for laser irradiation (200) depicted in FIG. 2i is between about 157 to 308 nanometers (nm). The fluence is between about 0.1 to 1.5 joules/cm$^2$ to melt the amorphous silicon ($\alpha$-Si) layer but not the polycrystalline silicon. At the same time, the dopants (205) diffuse uniformly to the melt depth, and close to the gate/gate oxide interface. Hence, the poly depletion effect is greatly reduced. It will be appreciated by those skilled in the art that the high regrowth velocity of the $\alpha$-Si layer enables it to recrystallize from the underlying polysilicon.

It will also be apparent to those skilled in the art that the method disclosed in the present invention teaches the selective etching of polysilicon to a desired thickness after the initial deposition such that a lower laser fluence is needed to melt a relatively thin polysilicon layer. In this manner, there will be less induced thermal stress and the melting process is more controllable. Also, the present invention teaches the spatial confinement of gate electrode during melting (laser annealing). This is done by depositing the polysilicon into a pre-defined "trench" (see (155) in FIG. 2c) such that the polysilicon is surrounded by silicon nitride (Si$_3$N$_4$) or any high melting point material or dielectric/ceramic stack that is compatible with CMOS fabrication process. Some candidate materials are shown in the Table below, and they should not melt during the melting of amorphized polysilicon.

| Material | Melting Pt. (° C.) |
|---|---|
| TiN | 2930 |
| TaN | 3087 |
| Si$_3$N$_4$ | 1900 |
| crystalline Si | 1410 |
| amorphous Si | ~1110–1210 |

Furthermore, the liquefied gate electrode will not have uncontrolled flow, and upon solidification, the gate electrode will be self-aligned to the pre-defined trench.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, depositing amorphous silicon into the trench rather than depositing polysilicon and then in-situ amorphizing a portion thereof.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon electrode with reduced dopant depletion comprising:

providing a substrate;

forming a dielectric layer over said substrate;

forming a polysilicon layer over said dielectric layer;

in-situ amorphizing upper portion of said polysilicon layer by implanting ions into said polysilicon layer to form an amorphous ($\alpha$-Si) layer over said polysilicon layer; then doping said polysilicon layer by implanting ions; and performing, laser irradiation of selected wavelength and fluence to melt and regrow said $\alpha$-Si layer while at the same time driving said ions deeply into said polysilicon layer adjacent said underlying dielectric layer.

2. The method of claim 1, wherein said substrate is silicon.

3. The method of claim 1, wherein said dielectric layer is formed by thermal growth at a temperature between about 700 to 1000° C.

4. The method of claim 1, wherein said dielectric layer has a thickness between about 100 to 600 Å.

5. The method of claim 1, wherein said polysilicon layer is formed through an LPCVD method employing silane SiH$_4$ as a silicon source material at a temperature range between about 400 to 700° C.

6. The method of claim 1, wherein said polysilicon layer has a thickness between about 1100 to 5000 Å.

7. The method of claim 1, wherein said in-situ amorphizing said upper portion of said polysilicon layer is accomplished by ion implanting Si at a dosage level between about $1\times10^{14}$ to $1\times10^{16}$ atoms/cm$^2$, and energy level between about 50 to 200 KeV.

8. The method of claim 1, wherein said $\alpha$-Si layer has a thickness between about 100 to 1500 Å.

9. The method of claim 1, wherein said doping said polysilicon layer is accomplished by implanting B$^+$, BF$_2^+$, P$^+$, As$^+$ ions at a dosage level between about $5\times10^{14}$ to $1\times10^{16}$ atoms/cm$^2$, and energy level between about 0.5 to 50 KeV.

10. The method of claim 1, wherein said performing said laser irradiation is accomplished at a wavelength between about 157 to 308 nanometers, and fluence of between about 0.1 to 1.5 J/cm$^2$.

11. A method of reducing polysilicon depletion in polysilicon electrodes in MOS transistors comprising the steps of:

providing a substrate;

forming a pad oxide layer over said substrate;

forming a nitride layer over said pad oxide layer;

patterning said nitride layer to form a trench over said pad oxide layer;

removing said pad oxide layer and exposing said substrate at the bottom of said trench;

optionally forming and removing a sacrificial layer;

forming a gate oxide layer over said substrate at the bottom of said trench;

forming a polysilicon layer over said substrate, including within said trench;

performing chemical mechanical polishing (CMP) to remove excess polysilicon over said trench;

selective etching said polysilicon layer in said trench to a desired thickness;

in-situ amorphizing upper portion of said polysilicon layer by implanting ions into said polysilicon layer to form an amorphous ($\alpha$-Si) layer over said polysilicon layer;

doping said polysilicon layer by implanting ions;

performing laser irradiation of selected wavelength and fluence to melt and regrow said $\alpha$-Si layer while at the same time driving said ions deeply into said polysilicon electrode reaching but adjacent said underlying oxide layer; and continuing the completion of said MOS transistor by a depositing another material into said trench followed by CMP to form a contact.

12. The method of claim 11, wherein said substrate is silicon.

13. The method of claim 11, wherein said pad oxide layer is formed. by thermal growth at a temperature between about 700 to 1000° C.

14. The method of claim 11, wherein said pad oxide layer has a thickness between about 100 to 600 Å.

15. The method of claim 11, wherein said nitride layer is formed by reacting dichlorosilane ($SiCl_2H_2$), or silane ($SiH_4$), with ammonia ($NH_3$) in an CVD at a temperature between about 300 to 900° C.

16. The method of claim 11, wherein said nitride layer has a thickness between about 1000 to 3000 Å.

17. The method of claim 11, wherein said gate oxide layer is thermally grown at a temperature between about 900 to 1200° C., or deposited using CVD.

18. The method of claim 11, wherein said gate oxide has a thickness between about 10 to 150 Å.

19. The method of claim 11, wherein said polysilicon layer is formed through an LPCVD method employing silane $SiH_4$ as a silicon source material at a temperature range between about 400 to 700° C.

20. The method of claim 11 wherein said polysilicon layer has a thickness between about 1100 to 5000 Å.

21. The method of claim 11, wherein said etching said polysilicon layer is accomplished with a recipe comprising $Cl_2$, $HeO_2$, HBr, He.

22. The method of claim 11, wherein said in-situ amorphizing said upper portion of said polysilicon layer is accomplished by ion implanting Si or $Ge^+$ at a dosage level between about $1\times10^{14}$ to $1\times10^{16}$ atoms/cm$^2$, and energy level between about 50 to 200 KeV.

23. The method of claim 11, wherein said α-Si layer has a thickness between about 100 to 1500 Å.

24. The method of claim 11, wherein said doping said polysilicon layer is accomplished by implanting $B^+$, $BF_2^+$, $P^+$, $As^+$ ions at a dosage level between about $5\times10^4$ to $1\times10^{16}$ atoms/cm$^2$, and energy level between about 0.5 to 50 KeV.

25. The method of claim 11, wherein said performing said laser irradiation is accomplished at a wavelength between about 157 to 308 nanometers, and fluence of between about 0.1 to 1.5 J/cm$^2$.

* * * * *

UNITED STATES PATENT AND TRADEMARK OFFICE
CERTIFICATE OF CORRECTION

PATENT NO. : 6,387,784 B1
DATED : May 14, 2002
INVENTOR(S) : Yung Fu Chong, Randall Cher Liang Cha, Lap Chan and Kin Leong Pey It is certified that error appears in the above-identified patent and that said Letters Patent is hereby corrected as shown below:

<u>Title page,</u>
Item [74], delete "Sergin Oktay", and replace with -- Sevgin Oktay --.

Signed and Sealed this

Third Day of September, 2002

Attest:

Attesting Officer

JAMES E. ROGAN
Director of the United States Patent and Trademark Office